United States Patent
Wu et al.

(10) Patent No.: US 9,449,867 B2
(45) Date of Patent: Sep. 20, 2016

(54) VHF ETCH BARRIER FOR SEMICONDUCTOR INTEGRATED MICROSYSTEM

(71) Applicant: Taiwan Semiconductor Manufacturing Co., Ltd., Hsin-Chu (TW)

(72) Inventors: Tzu-Heng Wu, New Tapei (TW); Yi-Hsien Chang, Shetou Township (TW); Kai-Chih Liang, Zhubei (TW); Yi Heng Tsai, Hsinchu (TW); Wei-Cheng Shen, Tainan (TW); Chun-Ren Cheng, Hsin-Chu (TW); Chun-Wen Cheng, Zhubei (TW); Han-Chin Chiu, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 157 days.

(21) Appl. No.: 14/306,643

(22) Filed: Jun. 17, 2014

(65) Prior Publication Data

US 2015/0364363 A1    Dec. 17, 2015

(51) Int. Cl.
*B81C 3/00* (2006.01)
*B81B 7/00* (2006.01)
*H01L 21/762* (2006.01)
*H01L 23/00* (2006.01)
*H01L 27/092* (2006.01)

(52) U.S. Cl.
CPC ......... *H01L 21/76232* (2013.01); *B81B 7/008* (2013.01); *B81C 3/001* (2013.01); *H01L 24/89* (2013.01); *H01L 27/092* (2013.01); *B81B 7/0025* (2013.01); *B81B 7/0054* (2013.01)

(58) Field of Classification Search
CPC ........... H01L 21/76232; H01L 27/092; H01L 24/89; H01L 2224/04; B81B 7/008; B81B 7/0025; B81B 7/0054; B81C 1/00238; B81C 2201/0132; B81C 2201/0135; B81C 2201/014; B81C 2203/0771
See application file for complete search history.

(56) References Cited

U.S. PATENT DOCUMENTS

| | | | | |
|---|---|---|---|---|
| 7,119,442 | B2* | 10/2006 | Ito | ..................... H01L 21/76807 257/211 |
| 7,396,740 | B2* | 7/2008 | Bakke | ................. B81C 1/00142 438/455 |
| 7,943,410 | B2* | 5/2011 | Le Neel | ............. B81C 1/00246 257/E21.499 |
| 8,035,176 | B2* | 10/2011 | Jung | ..................... B81C 1/0023 257/415 |
| 8,481,365 | B2 | 7/2013 | Verhelijden et al. | |

(Continued)

OTHER PUBLICATIONS

Bakke, et al. "Etch Stop Materials for Release by Vapor HF Etching." 16th Micro Mechanics Europe Workshop, MME 2005. ProceedingsGöteborg: Inform Trycket AB, published in 2005.

*Primary Examiner* — Michael Trinh
(74) *Attorney, Agent, or Firm* — Eschweiler & Associates, LLC (57) ABSTRACT

The present disclosure relates to an integrated microsystem with a protection barrier structure, and an associated method. In some embodiments, the integrated microsystem comprises a first die having a plurality of CMOS devices disposed thereon, a second die having a plurality of MEMS devices disposed thereon and a vapor hydrofluoric acid (vHF) etch barrier structure disposed between the first die and the second die. The second die is bonded to the first die at a bond interface region. The vHF etch barrier structure comprises a vHF barrier layer over an upper surface of the first die, and a stress reduction layer arranged between the vHF etch barrier layer and the upper surface of the first die.

20 Claims, 8 Drawing Sheets

(56) References Cited

U.S. PATENT DOCUMENTS

2010/0264520 A1* 10/2010 Ogawa ............... H04L 23/3735
                                                      257/618
2010/0295138 A1    11/2010 Montanya Silvestre et al.
2013/0140653 A1*   6/2013 Chu .................... B81C 1/00039
                                                      257/415

* cited by examiner

VHF ETCH BARRIER FOR SEMICONDUCTOR INTEGRATED MICROSYSTEM

BACKGROUND

In a CMOS MEMS micro system, various methods for the release of MEMS devices exist. One of the methods is to remove a sacrificial material by a wet etching process using hydrofluoric acid (HF). The use of vapor phase HF (vHF) etching provides even faster and more complete removal of the sacrificial material than liquid phase HF. However, vHF is extremely corrosive and can damage inter-metal dielectrics of typical CMOS circuits, which are not resistant to vHF.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In fabrication of a CMOS MEMS system, vapor phase HF (vHF) etching can be used to release MEMS devices. During the release process, a vHF protection barrier is needed to cover and chemically isolate the CMOS devices from being damaged by the vHF. One type of vHF protection barrier that has been used is a film of metallic material. Metallic films, although somewhat resistive to vHF, can introduce electrical shorts if applied as a continuous layer on the entire upper surface of the CMOS substrate and therefore are less than ideal. Ceramic films, which are electrically insulating, have also been used to resist vHF etching. However, because ceramic films are brittle and the upper surface of the CMOS substrate is non-planar; ceramic films deposited over such a non-planar surface can experience an uneven stress distribution near non-planar surface features, such as divots or bumps. This stress can cause cracks in the ceramic film, particularly during or after processes such as bonding, grinding, or chemical mechanical polishing (CMP). The cracking can start in localized areas, but can spread over the entire wafer or die. Because these cracks can allow vHF to seep through, ceramic films alone are also less than ideal as a vHF barrier for CMOS MEMs microsystems.

In order to achieve a reliable vHF etch barrier over non-planar surface features, the present disclosure sets forth improved vHF etch barrier structures and manufacturing methods there for. In some embodiments, the vHF etch barrier structures comprise two barrier layers. A first barrier layer, which is somewhat malleable and has a first Young's modulus, is disposed over a non-planar surface region which is easily eroded by vHF. A second non-conductive barrier layer, which is somewhat brittle and has a second Young's modulus that is higher than the first Young's modulus, is then disposed above the first barrier layer. The second barrier layer has a high resistance to vHF to provide protection for the non-planar surface region which could otherwise be eroded by the vHF. By including the first, somewhat-malleable barrier layer under the second, highly-vHF-resistant barrier layer, the resultant vHF etch barrier structure exhibits a high structural integrity as well as a high vHF resistance. Thus, for cases when the vHF etch barrier structure is subjected to bonding, grinding, or CMP; the vHF etch barrier can tolerate larger die/wafer warpage or stress without cracking, and thus tends to produce higher yields compared to previously known techniques.

Figure 1A:
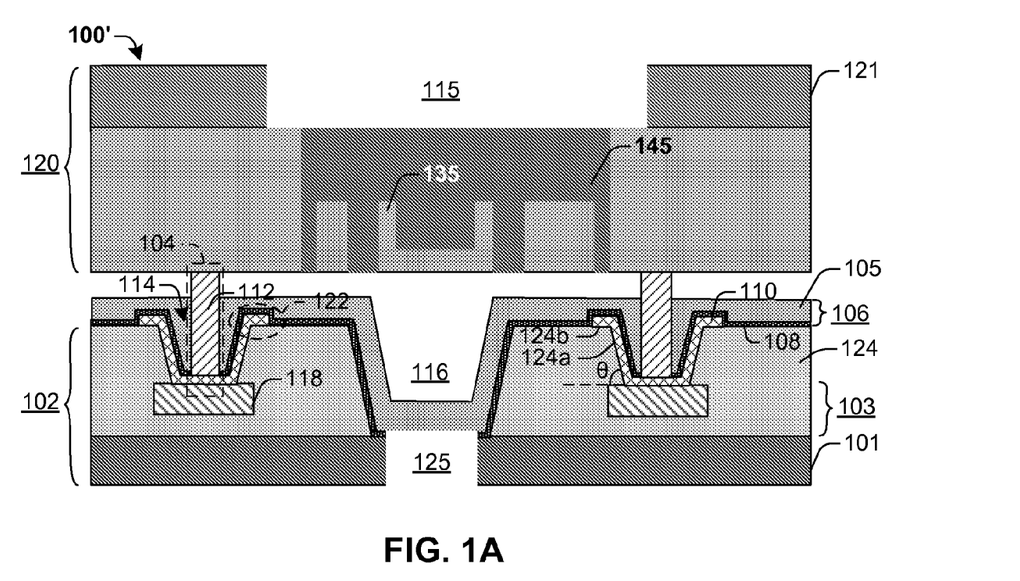
FIGS. 1A and 1B illustrate cross-sectional views of some embodiments of a vHF etch barrier structure for an integrated micro system.

FIG. 1a illustrates a cross-sectional view of some embodiments of an integrated microsystem 100 with a vHF etch barrier structure 106. The integrated system 100 comprises a first die 102, a second die 120, and a vHF etch barrier structure 106 disposed between the first die 102 and the second die 120. The first die 102 includes a first bulk substrate 101 with one or more interconnect layers 103, such as metal0, metal1, metal2, etc.; and the second die 120 includes a second bulk substrate 121. The first and second dies 102, 120 are bonded together at a bond interface region 104, such as a bonding ring. The first die 102 has a plurality of CMOS devices disposed on or in its substrate 101, and the second die 120 has a plurality of MEMS devices disposed thereon. Notably, the upper surface of the first die 102 is not an ideal flat surface, but rather is a non-planar surface. For example, the illustrated upper surface of the first die 102 comprises a conductive interconnect feature 118, such as a landing pad, and a conductive bonding element 112. The conductive bonding element 112, which can be a bonding ring in some embodiments, electrically couples the conductive interconnect feature 118 to a MEMS device on the second die 120 and physically couples the first die 102 to the second die 120.

The vHF etch barrier structure 106 comprises a first barrier layer 110, which may be referred to as a stress reduction layer in some embodiments, and a second barrier layer 108, which may be referred to as a vHF barrier layer in some embodiments. The vHF barrier layer 108 is disposed over an upper surface of the first die 102, and the stress reduction layer 110 is disposed between the vHF barrier layer 108 and the upper surface of the first die 102. In some embodiments, the vHF barrier layer 108 can cover the entire upper surface of the first die 102 except at the bond interface region 104. This upper surface of the first die 102 can be a dielectric region 124, such as an interlayer dielectric (ILD), which can be SiO2 or a low-k dielectric material, for example.

The stress reduction layer 110 is disposed onto non-planar features of the upper surface of the first die 102, such as corners or turns, where the second barrier layer 108 is susceptible to stress concentration. For example, the stress reduction layer 110 is disposed onto intersections of sidewall surfaces 124a and lateral surfaces 124b of recesses or bumps disposed along the upper surface of the first die 102. The sidewall surfaces 124a of the recesses or the bumps are not necessary perpendicular to the lateral surfaces. Instead, the sidewall surfaces 124a can have a tapered profile, or in another words, a "V" shape. A tilt angle θ of the sidewall can be in a range of from about 50 degrees to about 85 degrees. The "V" shape sidewall can help ensure the stress reduction layer 110 is easily formed on the portions of the upper surface of the first die 102.

The stress reduction layer 110 has a first Young's modulus so it can bear relatively large stress without cracking. In some embodiments, the stress reduction layer 110 has a Young's modulus smaller than about 120 gigapascals (GPa), more particularly, about 1-100 GPa. In many embodiments, applicable materials are metals that are somewhat malleable or ductile. For example, the stress reduction layer 110 can comprise aluminum (Al) with a Young's modulus of about 70 GPa. The stress reduction layer 110 can comprise metal alloys, for example, aluminum (Al), copper (Cu), Titanium (Ti), Tantalum (Ta) or the combination alloys thereof. The stress reduction layer 110 can comprise single or multiple layers with different materials. In one example, the stress reduction layer 110 has a substantially uniform thickness which is in a range of about 0.4 micrometers (μm) to about 0.8 μm.

The vHF barrier layer 108 is electrically insulating to help prevent any electrical shorts from occurring. The vHF barrier layer 108 covers most areas of the upper surface of the first die 102 and provides global coverage. One applicable material of the vHF barrier layer 108 is ceramic with a Young's modulus from about 150 GPa to about 400 GPa. For example, the vHF barrier layer 108 can comprise an aluminum oxide or aluminum fluoride film. Though the vHF barrier layer 108 has a larger Young's modulus than the stress reduction layer 110, which means the vHF barrier layer 108 is more brittle than the stress reduction layer 110, the fact that the stress reduction layer 110 underlies the vHF barrier layer 108 helps to release stress efficiently. This allows the resultant vHF etch barrier structure 106 to cover a change in height larger than at least about 10 μm. In one example, the vHF barrier layer 108 has a substantially uniform thickness which is in a range of about 10 nanometers (nm) to about 80 nm.

Figure 3:
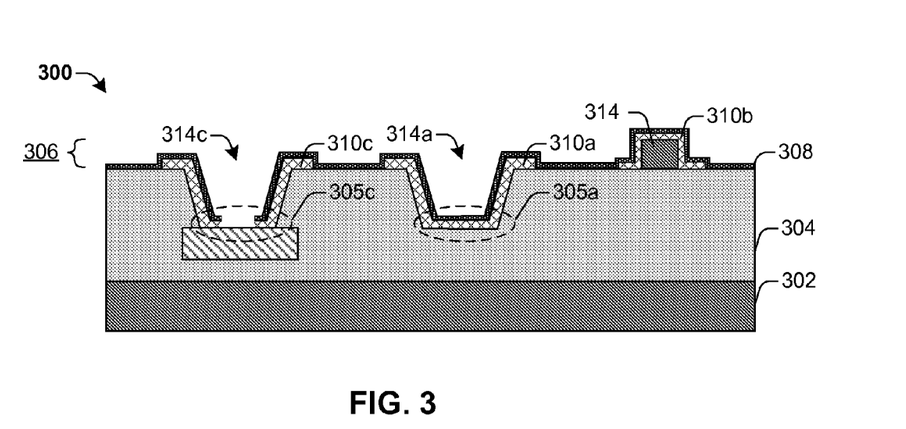
FIG. 3 illustrates a cross-sectional view of some other embodiments of a vHF etch barrier structure for an integrated micro system.

In some embodiments, the stress reduction layer 110 can cover the upper surface of the first die 102 at the bond interface region 104 while the vHF barrier layer 108 can extend over portions of the upper surface of the first die 102 without extending over the bond interface region 104. This allows electrical coupling between the MEMs devices and CMOS devices to be ohmic, but tunnel junctions can also be used where a thin vHF barrier layer may still be present in bond interface region 104. Further, the stress reduction layer 110 can be disposed covering corners of an opening 114 around the bond interface region 104. The stress reduction layer 110 can cover sidewall and bottom surfaces of the opening 104 and extend laterally out of the opening 104 to a lip 122. FIG. 3 shows a corresponding top view 300 of some embodiments of the integrated microsystem 100. The opening 114, a portion of the stress reduction layer 110 and the conductive bonding element 112 can be a ring shape. The portion of the stress reduction layer 110 can extend out of the opening 114. In some embodiments, the vHF barrier layer 108 can cover the upper surface of the first die 102 except at the bond interface region 104.

The first die 102 can include a sacrificial material 145, which has a first removal rate via vHF, to cover and/or encapsulate MEMS structures 135, which have a second, smaller removal rate via vHF. Openings 116, 125 and 115 are patterned through the first die 102 and the second die 120. During a release process, vHF travels through patterned openings 115, 116 and 125 to etch away the sacrificial material 145 and release the MEMS structures 135 and leave the MEMs structures substantially in tact. The vHF barrier layer 108 is exposed to the vHF during the release etch and protects the CMOS die 102 from being damaged.

Figure 1B:
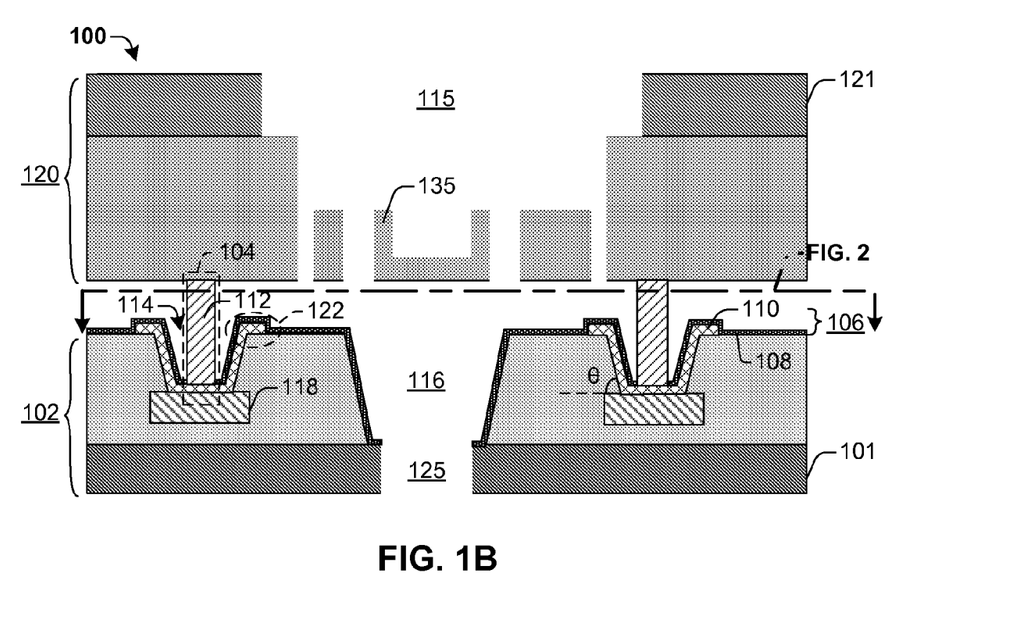

FIG. 1b shows the integrated microsystem after the sacrificial material 145 is removed. A dielectric layer 105 can be etched away by the vHF during the process as well. As shown, after the sacrificial material 145 has been removed, the MEMS die 120 includes movable MEMs structure 135, which is suspended by arms or springs from a bulk portion of the MEMs die or is otherwise free to vibrate or move relative to the CMOS die 102. For example, the MEMs structure 135 can represent a movable diaphragm through which a current or voltage is passed. This diaphragm can measure a capacitance between itself and another fixed electrode, which can be located on the MEMS die 120 or on the CMOS die 102. A pressure to be measured changes a location of the diaphragm such that a capacitance between the fixed plate and the diaphragm is changed. The capacitance can be processed and converted to the measured pressure by logic devices on the CMOS die 102. In other embodiments, the MEMs structure 135 can be a rest mass of an accelerator or gyroscope, for example.

Notably, during the release process, the vHF barrier layer 108 is exposed to the vHF and protects the CMOS die 102 from being damaged. In particular, conductive interconnect feature 118 and a conductive bonding element 112, which are easily eroded by vHF, are protected at least in large part from the vHF.

Figure 2:
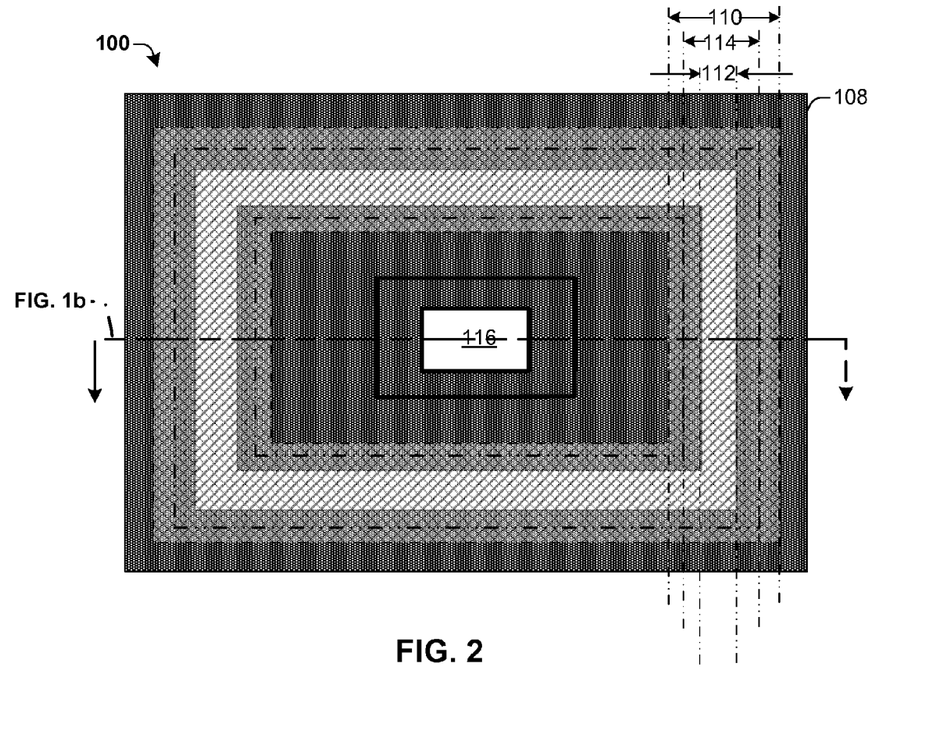
FIG. 2 illustrates a top view of some embodiments of a vHF etch barrier structure for an integrated microsystem.

FIG. 2 shows a corresponding top view 200 of some embodiments of the integrated microsystem 100. The opening 114, a portion of the stress reduction layer 110 and the conductive bonding element 112 can be a ring shape. The portion of the stress reduction layer 110 can extend out of the opening 114 for better stress releasing.

FIG. 3 shows some other example vHF etch barrier structures 306 for an integrated microsystem 300. In these examples, a stress reduction layer 310 is disposed separately onto corners of an upper surface of a dielectric layer 304. A vHF barrier layer 308 can be disposed over the stress reduction layer 310 to provide global coverage protection of the dielectric layer 304. At bottom regions 305 of recesses 314 covered by the protection barrier structure, the vHF barrier layer 308 and/or the stress reduction layer 310 can be either be discontinuous (see bottom region 305c) or can be continuous (see bottom region 305a). In some other embodiments, the recesses 314 can also be extended completely through the dielectric layer 304. In still other embodiments, the stress reduction layer 310b is formed over a feature 314 extending vertically upward from the upper surface of dielectric layer 304, and the vHF barrier layer 308 is disposed over this "top-hat shaped" stress reduction layer 310b.

Figure 4:
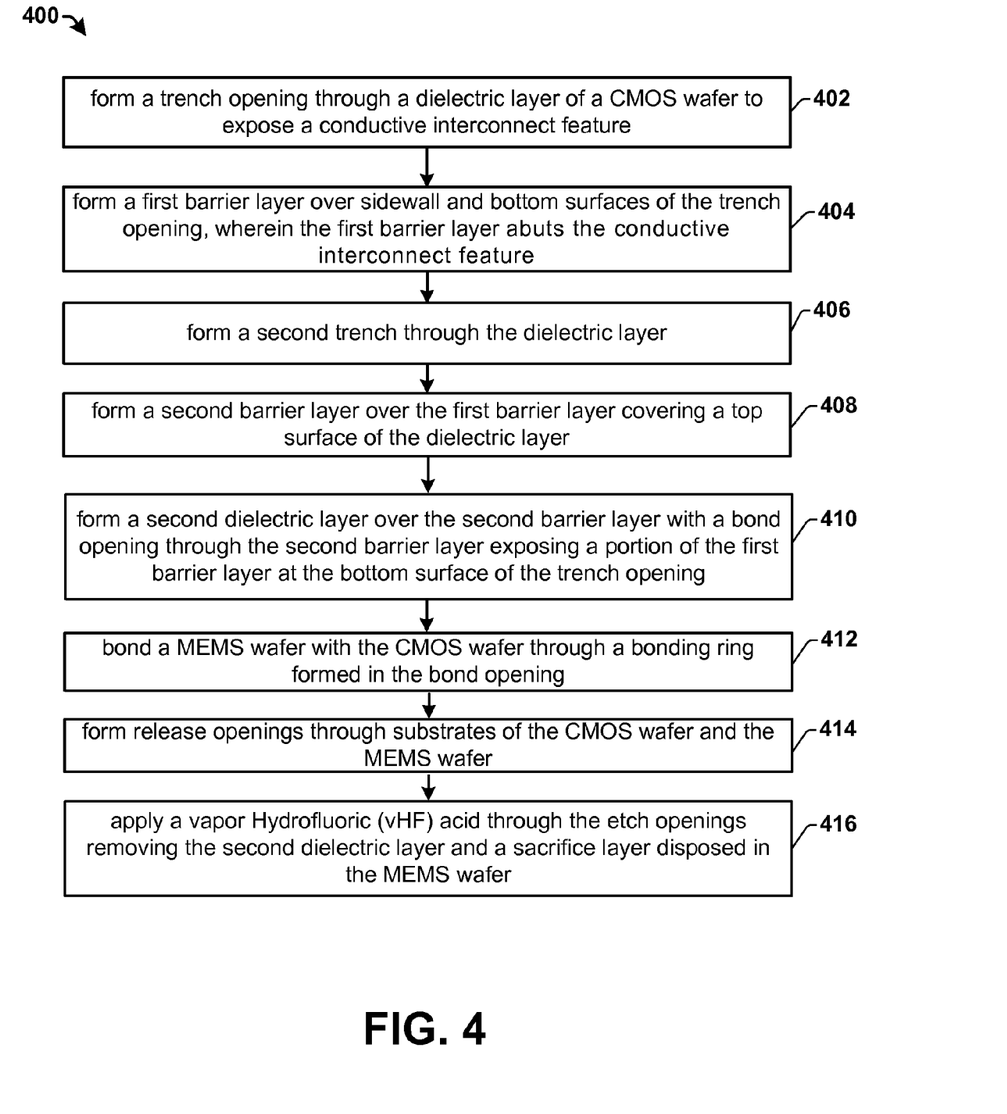
FIG. 4 illustrates a flow diagram of some embodiments of a method of forming a vHF etch barrier structure for an integrated microsystem.

FIG. 4 shows a flow diagram of some embodiments of a method 400 of forming a vHF etch barrier structure for an integrated microsystem. While disclosed methods (e.g., methods 400) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 402, a trench opening is formed through a dielectric layer of a CMOS wafer to expose a conductive interconnect feature of the CMOS wafer. In some embodiments, the conductive interconnect feature of the CMOS wafer can be a metal layer disposed at the back end of the CMOS wafer. The dielectric layer can be an interlayer dielectric (ILD). The trench opening is designed to bond the CMOS wafer to a MEMS wafer.

At 404, a first barrier layer is formed over sidewall and bottom surfaces of the trench opening, wherein the first barrier layer abuts the conductive interconnect feature. The first barrier layer extends out of the trench opening covering corners of the trench opening where the stress concentrates. The first barrier layer is applied as a stress reduction layer. The first barrier layer comprises a ductile material with a relatively small Young's modulus. In some embodiments, the first barrier layer is formed by aluminum (Al), copper (Cu), Titanium (Ti), Tantalum (Ta) or the combination alloys thereof. The first barrier layer can be formed by a plurality of distinct metal layers.

At 406, a second trench is formed through the first dielectric layer. The second trench is formed to provide an opening by which vHF can pass through to release MEMS devices.

At 408, a second barrier layer is formed over the first barrier layer. The second barrier layer provides the CMOS wafer a global coverage that protects the CMOS wafer from the vHF. The second barrier layer is non-conductive to avoid introducing undesirable electrical shorts. The second barrier layer can be formed by an atomic layer deposition (ALD) process, which is advantageous in that it limit thermal budgeting issues.

At 410, a second dielectric layer is formed over the second barrier layer with a bond opening through the second barrier layer exposing a portion of the first barrier layer at the bottom surface of the trench opening.

At 412, a MEMS wafer is bonded to the CMOS wafer through a bonding ring positioned in the trench opening. The MEMS wafer and the CMOS wafer can be bonded together by a eutectic bonding process.

At 414, release openings are formed through substrates of the CMOS wafer and the MEMS wafer. Grinding or chemical mechanical polishing processes can be applied during the fabrication to thin the backside of the CMOS wafer and/or the MEMS wafer. The grinding or chemical mechanical polishing process will introduce significant stress. The disclosed vHF etch barrier structure has a better tolerance to such stress to avoid or limit global cracking starting from some corners. The release openings are formed to prepare for the releasing process. Some extra dielectric layers are deposited and patterned during the process. For example, patterned hard masks can be formed onto the backsides of the CMOS wafer and/or the MEMS wafer to help forming release openings.

At 416, vHF is applied through the etch openings to remove the second dielectric layer and a sacrificial layer disposed in the MEMS wafer. The vHF etch barrier structure protects the CMOS wafer from being damaged by the vHF.

FIGS. 5a-5h show some embodiments of cross-sectional views of protection barrier structure showing a method of forming protection barrier for an integrated microsystem.

Although FIGS. 5a-5h are described in relation to method 400, it will be appreciated that the structures disclosed in FIGS. 5a-5h are not limited to such a method.

Figure 5A:
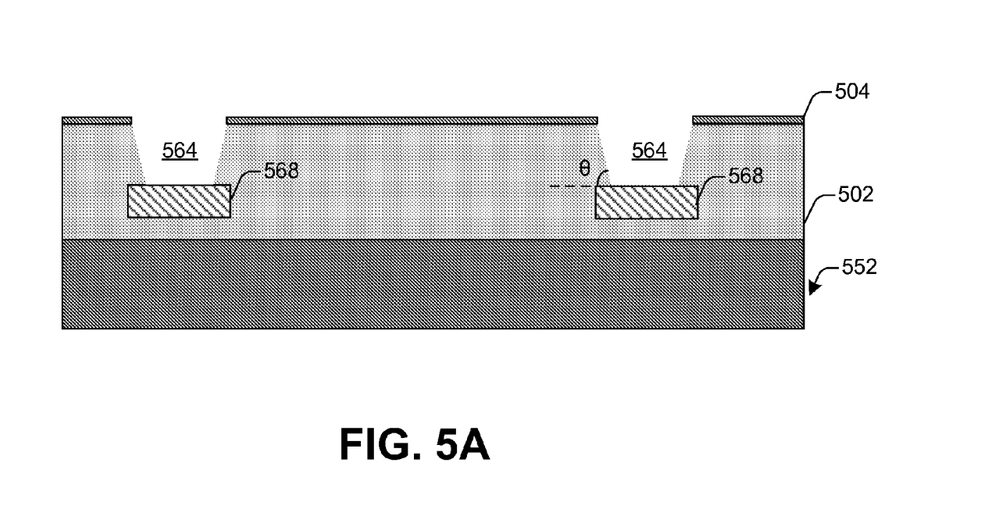
FIGS. 5A-5H illustrate some embodiments of cross-sectional views of a method of forming a vHF etch barrier structure for an integrated microsystem.

As shown in FIG. 5a, a trench opening 564 is formed through a dielectric layer 502 of a CMOS wafer 552 to expose a conductive interconnect feature 568 of the CMOS wafer 552. In some embodiments, the conductive interconnect feature 568 of the CMOS wafer 552 can be a metal layer, such as copper, aluminum or tungsten, disposed at the back end of the CMOS wafer 552. The dielectric layer 502 can be an interlayer dielectric (ILD). The trench opening 564 can be formed with a "V" shaped sidewall surface. A tilt angle of the "V" shaped sidewall can be in a range of from about 50 degrees to about 85 degrees. In some embodiments, a passivation layer 504 can be formed over the dielectric layer 502 before forming the trenching opening 564. The passivation layer 504 can comprise silicon nitride or silicon oxide.

Figure 5B:
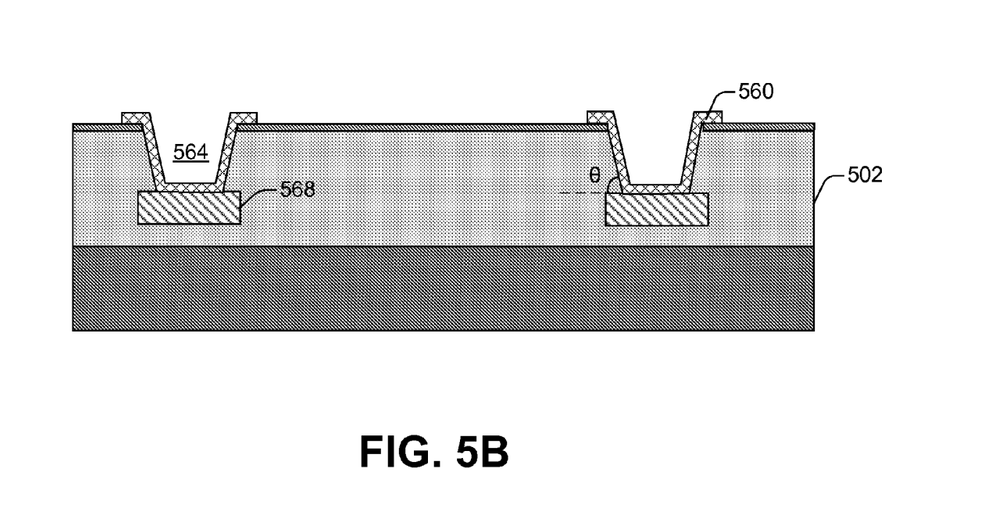

As shown in FIG. 5b, a first barrier layer 560 is formed over sidewall and bottom surfaces of the trench opening 564, wherein the first barrier layer 560 abuts the conductive interconnect feature 568. The first barrier layer 560 comprises a ductile material with a relatively small Young's modulus. In some embodiments, the first barrier layer 560 is formed by aluminum (Al), copper (Cu), Titanium (Ti), Tantalum (Ta) or the combination alloys thereof. The first barrier layer 560 can be formed by a plurality of distinct metal layers.

The first barrier layer 560 is thicker than a later formed second barrier layer. For example, in some embodiments, the first barrier layer 560 can be formed with a thickness in a range of from about 0.1 µm to about 1 µm. To avoid electrical shorts, the first barrier layer 560 is usually formed as a conformal layer, and is then patterned by photolithography or other techniques to result in separate or discontinuous portions. The first barrier layer 560 may not only be formed in the trench opening 564 designed as a bonding area, but may also be formed over other non-planar geometries along an upper surface of the dielectric layer 502, such as recesses or bumps. The first barrier layer 560 may cover sidewall and bottom surfaces of the recesses and extend out of the recesses in order to cover corners where stress concentrates. However, in some embodiments, not all non-planar geometries along the upper surface of the dielectric layer 502 are covered by the first barrier layer 560.

Figure 5C:
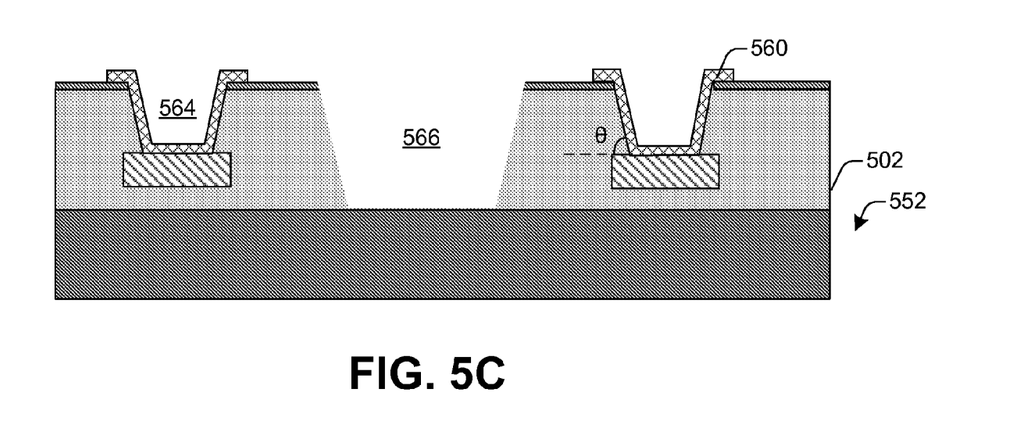

As shown in FIG. 5c, a second trench 566 is formed through the first dielectric layer 502. The second trench 566 is formed to provide a port where vHF to release MEMS devices can pass through.

Figure 5D:
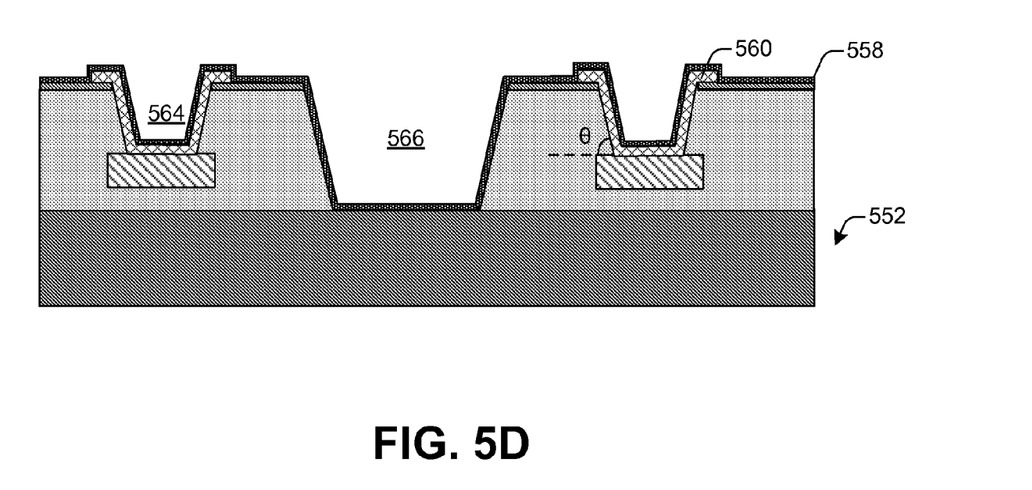

As shown in FIG. 5d, a second barrier layer 558 is formed over the first barrier layer 560. The second barrier layer 558 protects the CMOS wafer 552 from vHF. The second barrier layer 558 is non-conductive to avoid introducing undesirable electrical shorts. In some embodiments, the second barrier layer 558 can be conformally formed with a thickness in a range of from about 10 nm to about 10 µm. The second barrier layer 558 covers the whole upper surface of the CMOS wafer 552 in this step.

Figure 5E:
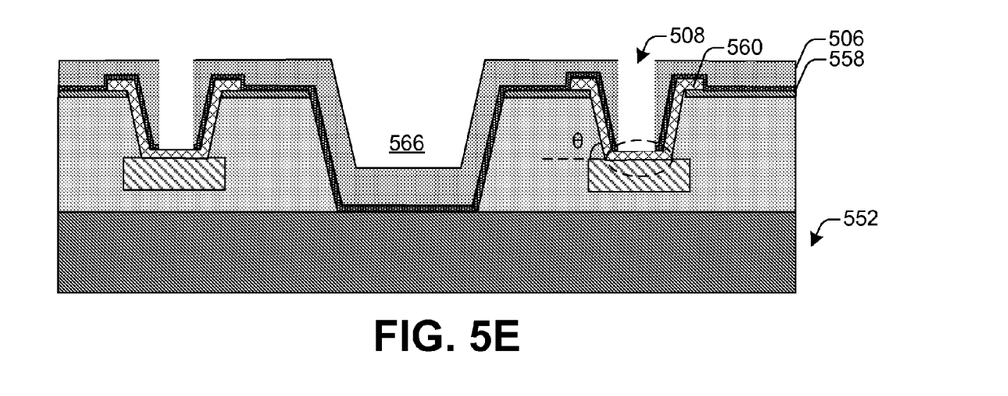

As shown in FIG. 5e, a second dielectric layer 506 is formed over the second barrier layer 558. Patterning, such as lithographic patterning, is carried out to form a bond opening 508 through the second barrier layer 558 to expose a portion of the first barrier layer 560 at the bottom surface of the trench opening. The second dielectric layer 506 and the second barrier layer 558 are patterned and etched to form the bond opening so that the CMOS wafer 552 can be bonded to a MEMS wafer later through a bonding ring disposed in the bond opening 508. The first barrier layer 560 may not be patterned and etched at this step if it is conductive.

Figure 5F:
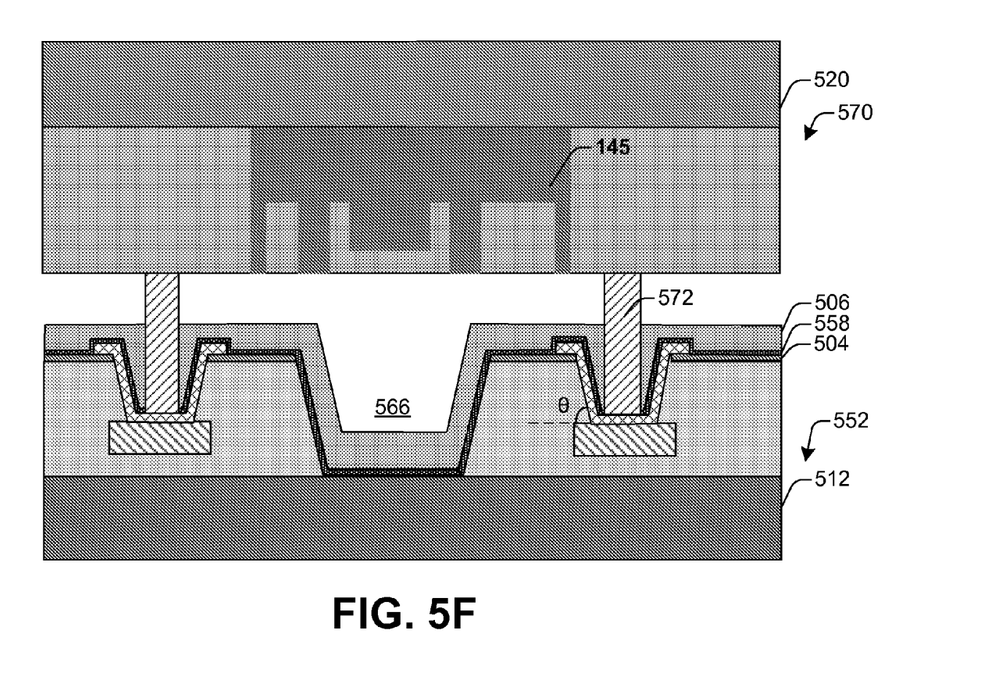

As shown in FIG. 5f, the MEMS wafer 570 is bonded to the CMOS wafer 552 through a bonding ring 572 positioned in the trench opening. Further, the bonding ring can be arranged in the bonding opening.

Figure 5G:
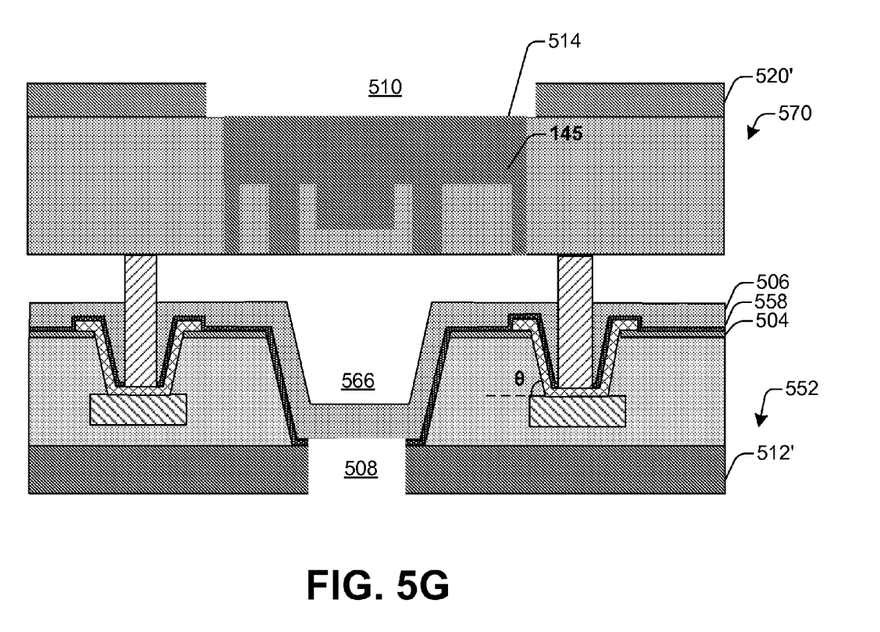

As shown in FIG. 5g, release openings 508 and 510 are formed through substrates of the CMOS wafer 552 and the MEMS wafer 570. A grinding or chemical mechanical polishing process can be applied during the fabrication to thin the backside 512 of the CMOS wafer 552 and/or the backside 520 of the MEMS wafer 570. For example, a thickness of a thinned backside 512' of the CMOS wafer 552 can be about 400 µm and a thickness of a thinned backside 520' of the MEMS wafer 570 can be about 100 µm. Hard masks with thicknesses of about 4 µm can be formed onto backsides of the CMOS wafer 552 and the MEMS wafer 570 to patterning the openings 508 and 510. In an example embodiment, the release opening 508 through the substrate of the CMOS wafer 552 can have an area about 500×500 µm and the release opening 510 through the substrate of the MEMS wafer 570 can have an area about 800×800 µm. A sacrificial layer 514 is disposed in the MEMS wafer 570 to support the MEMS devices.

Figure 5H:
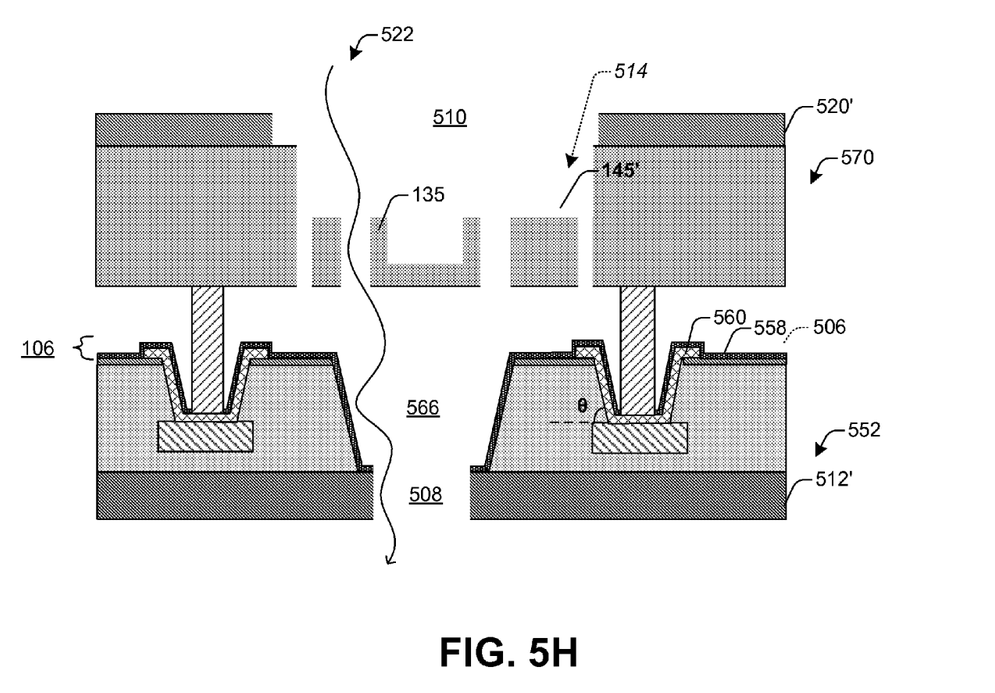

As shown in FIG. 5h, vHF 522 is applied through the etch openings 510, 566 and 508 to remove the second dielectric layer 506 and the sacrificial layer 514 (shown in FIG. 5g). The vHF etch barrier structure 106 made up of the first barrier layer 560 and the second barrier layer 558 protects the CMOS wafer 552 from being damaged by the vHF 522. The bonded wafers 570, 552 can then be diced along scribe lines (not shown) to form individual dies, which include MEMs structure 135 on MEMs die and CMOS devices on CMOS die, wherein the MEMs die and CMOS die are bonded together.

In some embodiments, the present disclosure relates to an integrated microsystem with a protection barrier structure. The integrated microsystem comprises a first die, a second die and a vapor hydrofluoric acid (vHF) etch barrier structure disposed between the first die and the second die. The first die has a plurality of CMOS devices disposed thereon and the second die has a plurality of MEMS devices disposed thereon. The second die is bonded to the first die at a bond interface region. The vHF etch barrier structure comprises a vHF barrier layer disposed over an upper surface of the first die, and a stress reduction layer arranged between the vHF etch barrier layer and the upper surface of the first die.

In other embodiments, the present disclosure relates to a semiconductor integrated microsystem. The semiconductor integrated microsystem comprises a first die, a second die and a vapor hydrofluoric (vHF) etch barrier structure disposed between the first die and the second die. The first die has a plurality of CMOS devices disposed thereon and the second die having a plurality of MEMS devices disposed thereon. The second die is bonded to the first die at a bonding interface region. The vHF etch barrier structure comprises a first barrier layer disposed over an upper surface of the first die, and a second barrier layer disposed over the first barrier layer and covering the upper surface of the first die except at the bonding interface region.

In yet other embodiments, the present disclosure relates to a method of forming a vapor hydrofluoric (vHF) etch barrier structure for a semiconductor integrated microsystem. In the method, a trench opening is formed through a dielectric layer of a CMOS wafer to expose a conductive interconnect feature of the CMOS wafer. Then a first barrier layer is formed over sidewall and bottom surfaces of the trench opening. The first barrier layer abuts the conductive interconnect feature. Then, a second barrier layer is formed over the first barrier layer. Then a MEMS wafer is bonded to the CMOS wafer through a bonding ring positioned in the trench opening. Then release openings are formed through substrates of the CMOS wafer and the MEMS wafer. At last, a vapor Hydrofluoric (vHF) acid is applied through the etch openings to remove a sacrificial layer disposed in the MEMS wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated microsystem with a protection barrier structure, comprising:
   a first die having a plurality of CMOS devices disposed thereon, wherein a bond interface region is located at a recessed surface of the first die, which is connected to an uppermost lateral surface of the first die by tilted sidewall surfaces;
   a second die having a plurality of MEMS devices disposed thereon, wherein the second die is bonded to the first die at the bond interface region; and
   a vapor hydrofluoric acid (vHF) etch barrier structure disposed between the first die and the second die, wherein the vHF etch barrier structure comprises a stress reduction layer and a vHF etch barrier layer, the stress reduction layer extending over the recessed surface of the bond interface region, over the tilted sidewall surfaces, and over the uppermost lateral surface of the first die, and the vHF etch barrier layer extending over the stress reduction layer and extending past an outer edge of the stress reduction layer to directly cover the uppermost lateral surface of the first die.

2. The protection barrier structure of claim 1, wherein the first die comprises a conductive interconnect feature at the bond interface region, and further comprising:
a conductive bonding element extending between the conductive interconnect feature and a MEMS device on the second die;
wherein the stress reduction layer is a conductive material in direct contact with the vHF etch barrier layer.

3. The protection barrier structure of claim 1, wherein the stress reduction layer comprises aluminum and the vHF barrier layer comprises a ceramic film.

4. The protection barrier structure of claim 1, wherein the stress reduction layer is disposed onto the bond interface region that is located at a position lower than the uppermost lateral surface of the first die.

5. The protection barrier structure of claim 4, wherein the upper surface of the die comprises a "V" shaped sidewall connecting the uppermost lateral surface of the first die and the bond interface region on which the stress reduction layer is disposed.

6. A semiconductor integrated microsystem comprising:
a first die having a plurality of CMOS devices disposed thereon;
a second die having a plurality of MEMS devices disposed thereon, wherein the second die is bonded to the first die at a bonding interface region located at a bottom position of a recess within the first die and lowered from an uppermost surface of the first die; and
a vapor hydrofluoric (vHF) etch barrier structure disposed between the first die and the second die, wherein the vHF etch barrier structure comprises a first barrier layer disposed over an upper surface of the first die and extending conformally along a tilted sidewall surface and a bottom surface of the recess, and a second barrier layer disposed along an upper surface of the first barrier layer.

7. The semiconductor integrated microsystem of claim 6, wherein the first barrier layer has a Young's modulus smaller than about 120 gigapascals (GPa).

8. The semiconductor integrated microsystem of claim 6, wherein the first barrier layer is a stress-reduction layer to reduce stress due to non-planar surface geometries of at least one of the upper surface of the first die and the second barrier layer for the second barrier layer.

9. The semiconductor integrated microsystem of claim 6, wherein the first barrier layer and the second barrier layer are disposed on sidewalls of the recess while leaving at least a portion of the recess not filled.

10. The semiconductor integrated microsystem of claim 6, wherein the first barrier layer and the second barrier layer are disposed on sidewalls of the recess and extends continuously over an entire bottom surface of the opening between the sidewalls.

11. The semiconductor integrated microsystem of claim 9, wherein a pair of opposing sidewalls on either side of the bonding interface region exhibit a "V" shaped profile.

12. The semiconductor integrated microsystem of claim 6, wherein the second barrier layer comprises a non-conductive material.

13. The semiconductor integrated microsystem of claim 6, wherein the second barrier layer comprises a ceramic film.

14. The semiconductor integrated microsystem of claim 6, wherein the second barrier layer comprises aluminum oxide or aluminum fluoride or aluminum nitride.

15. The semiconductor integrated microsystem of claim 6, wherein the first barrier layer comprises a ductile material.

16. The semiconductor integrated microsystem of claim 6, wherein the first barrier layer comprises multiple layers comprising aluminum (Al), copper (Cu), Titanium (Ti), Tantalum (Ta) or an alloy made of a combination of Al, Cu, Ti and/or Ta.

17. A method of forming a vapor hydrofluoric (vHF) etch barrier structure for a semiconductor integrated microsystem comprising:
forming a trench opening through a dielectric layer of a CMOS wafer to expose a conductive interconnect feature of the CMOS wafer;
forming a first barrier layer over sidewall and bottom surfaces of the trench opening, wherein the first barrier layer abuts the conductive interconnect feature;
forming a second barrier layer over the first barrier layer;
bonding a MEMS wafer to the CMOS wafer through a bonding ring positioned in the trench opening;
forming release openings through substrates of the CMOS wafer and the MEMS wafer; and
applying a vapor Hydrofluoric (vHF) acid through the release openings to remove a sacrificial layer disposed in the MEMS wafer.

18. The method of claim 17, wherein the conductive interconnect feature is a metal layer of the CMOS wafer.

19. The method of claim 17, wherein the trench opening is formed with a "V" shaped sidewall surface.

20. The method of claim 17, further comprising:
forming a second trench through the dielectric layer before bonding the CMOS wafer with the MEMS wafer; and
forming a second dielectric layer over the second barrier layer with a bond opening through the second barrier layer exposing a portion of the first barrier layer at the bottom surface of the trench opening, wherein the bonding ring is formed in the bond opening.

* * * * *